United States Patent
Ogimoto

(10) Patent No.: US 9,166,148 B2
(45) Date of Patent: Oct. 20, 2015

(54) MANGANESE OXIDE THIN FILM AND OXIDE LAMINATE

(71) Applicant: FUJI ELECTRIC CO., LTD., Kawasaki-shi (JP)

(72) Inventor: Yasushi Ogimoto, Higashiyamato (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/365,442

(22) PCT Filed: Dec. 7, 2012

(86) PCT No.: PCT/JP2012/081759
§ 371 (c)(1),
(2) Date: Jun. 13, 2014

(87) PCT Pub. No.: WO2013/108507
PCT Pub. Date: Jul. 25, 2013

(65) Prior Publication Data
US 2014/0374749 A1   Dec. 25, 2014

(30) Foreign Application Priority Data
Jan. 20, 2012  (JP) .................................. 2012-009651

(51) Int. Cl.
*H01L 43/10* (2006.01)
*C30B 29/22* (2006.01)
(Continued)

(52) U.S. Cl.
CPC ............ *H01L 43/10* (2013.01); *C01G 45/1264* (2013.01); *C30B 23/02* (2013.01);
(Continued)

(58) Field of Classification Search
USPC .......................................... 257/43
See application file for complete search history.

(56) References Cited

U.S. PATENT DOCUMENTS 5,665,664 A   9/1997 Tomioka et al.
5,919,515 A   7/1999 Yano et al.
(Continued)

FOREIGN PATENT DOCUMENTS

EP   0864538 A1   9/1998
JP   H08-102528 A   4/1996
(Continued)

OTHER PUBLICATIONS

Yasushi Ogimoto et al., Interface-mediated phase control in ultrathin double-layer structures of perovskite manganites: Abstracts of the Meeting of the Physical Society of Japan, vol. 65, No. 1, Mar. 2010.
(Continued)

*Primary Examiner* — Thao P Le
(74) *Attorney, Agent, or Firm* — Rabin & Berdo, P.C.

(57) ABSTRACT

A manganese oxide thin film is formed on a plane of a substrate and has a composition $RMnO_3$, where R is at least one and preferably two trivalent rare earth elements selected from lanthanoids, and where both R and Mn form the same atomic layer parallel to the plane of the substrate. An oxide laminate, includes the manganese oxide thin film; and at least one strongly-correlated oxide thin film that is contiguous to the manganese oxide thin film, wherein a total thickness, t, of the oxide laminate, a thickness, tm, of the manganese oxide thin film, and a thickness, t1, of the strongly-correlated oxide thin film satisfy a relation, relative to a critical thickness, tc, by which the strongly-correlated oxide thin film has a metallic phase, as follows: $t=tm+t1>tc$ and $t1<tc$. Switching capabilities are ensured by a room temperature (Mott) phase transition.

5 Claims, 5 Drawing Sheets

(51) Int. Cl.
  *C30B 29/68* (2006.01)
  *H01L 49/00* (2006.01)
  *C01G 45/12* (2006.01)
  *C30B 23/02* (2006.01)
  *H01L 21/02* (2006.01)

(52) U.S. Cl.
  CPC ............... *C30B 29/22* (2013.01); *C30B 29/68* (2013.01); *H01L 21/02175* (2013.01); *H01L 21/02194* (2013.01); *H01L 21/02266* (2013.01); *H01L 49/003* (2013.01); *C01P 2002/34* (2013.01); *C01P 2002/77* (2013.01); *H01L 21/02565* (2013.01); *H01L 21/02631* (2013.01)

(56) References Cited

U.S. PATENT DOCUMENTS

| | | | |
|---|---|---|---|
| 6,136,457 | A | 10/2000 | Miyano et al. |
| 2007/0029593 | A1* | 2/2007 | Ramesh ................... 257/295 |
| 2013/0017442 | A1* | 1/2013 | Cha et al. ................ 429/211 |
| 2013/0200457 | A1 | 8/2013 | Ogimoto |
| 2014/0322602 | A1* | 10/2014 | Yamazaki et al. ............ 429/220 |

FOREIGN PATENT DOCUMENTS

| | | |
|---|---|---|
| JP | 08-133894 A | 5/1996 |
| JP | H09-63991 A | 3/1997 |
| JP | 10-255481 A | 9/1998 |
| JP | 10-261291 A | 9/1998 |
| JP | 2005-213078 A | 8/2005 |
| JP | 2008-156188 | 7/2008 |
| WO | WO-2012/172898 A1 | 12/2012 |

OTHER PUBLICATIONS

Y. Hu et al., "Strain and lattice distortion in (1 1 0)-epitaxial orthorhombic TbMnO3 multiferroic thin films grown by pulsed laser deposition" Applied Surface Science 258, vol. 258, Issue 23, (2012), pp. 9323-9325, Sep. 2012.

T.C Han et al., "Observation of large electric polarization in orthorhombic TmMnO$_3$ thin films" Applied Physics Letters 97, 232902(2010), Dec. 2010.

T.C. Han et al., "Strong coupling of magnetic and dielectric properties in the a-axis-oriented orthorhombic HoMnO$_3$ films" Applied Physics Letters 94, 082502, Feb. 2009.

* cited by examiner

MANGANESE OXIDE THIN FILM AND OXIDE LAMINATE

BACKGROUND OF THE INVENTION

1. Field of the Invention

The present invention relates to a manganese oxide thin film and an oxide laminate. More specifically, the present invention relates to a manganese oxide thin film and an oxide laminate undergoing a Mott transition by controlling temperature, electric field, magnetic field or exposure to light and undergoing switching of electrical, magnetic or optical properties thereof.

2. Background of the Related Art

It is a recent concern that the scaling law, that provides guidance for performance improvement of semiconductor devices, is finally imposing an end. With this concern, materials, other than the all-time used silicon, have attracted attention and allow novel operating principles. For example, in the field of spintronics incorporating the spin degree of freedom, development is underway for realizing high-density nonvolatile memories which allow high speed operation as fast as DRAM (dynamic random access memories).

Meanwhile, studies on strongly-correlated electron system materials have also been advanced to which the band theory, the fundamental theory of semiconductor device design, cannot be applied. During these studies, materials have been found which undergo huge and rapid change in physical properties resulting from phase transition of electron systems. In strongly-correlated electron system materials, not only the spin degree of freedom but also the orbital degree of freedom is involved in the state of a phase of electron systems, and thus various electronic phases with different orders formed by spin, electron and orbital emerge. A typical example of strongly-correlated electron system materials are perovskite-type manganese oxides which are known to have electron systems exhibiting a charge-ordered phase in which 3d electrons of manganese (Mn) are in order due to first-order phase transition or an orbital-ordered phase in which orbitals are in order.

In the charge-ordered phase and orbital-ordered phase, the electric resistance is high due to carrier localization and thus the electronic phase is insulating. The electronic phase has a magnetic property which corresponds to an antiferromagnetic phase due to superexchange and double exchange interactions. There are many cases, however, in which the electronic states of charge-ordered phases or orbital-ordered phases should be regarded as semiconducting, because although carriers in the charge-ordered phases and orbital-ordered phases are localized, the resistance is lower than that of so-called band insulators. However, the electronic phase of charge-ordered phases and orbital-ordered phases are herein referred to as an insulator phase as is customary. To the contrary, the electronic phase having a low resistance and a metal-like behaviour exhibits a ferromagnetic phase due to aligned spins. Although there are various definitions for the metallic phase, the metallic phase herein refers to "a phase having a positive temperature differential coefficient of resistivity". Correspondingly, the insulator phase can be re-defined as "a phase having a negative temperature differential coefficient of resistivity".

It is disclosed that the phenomena in which various switching capabilities emerge are observed in the single-crystal bulk materials having any of electronic phases among the charge-ordered phase, the orbital-ordered phase and a phase in which both charge and orbital are ordered, i.e., charge and orbital ordered phase, (see Japanese Patent Application Laid-open Nos. H8-133894, H10-255481, and H10-261291, respectively, Patent Documents 1 to 3). These phenomena are typically observed as a huge change in resistance or transition between an antiferromagnetic phase and a ferromagnetic phase. For example, a change in resistance by orders of magnitude in response to a magnetic field application is well known as the colossal magnetoresistive effect.

In order to prepare practical devices such as electronic devices, magnetic devices, as well as optical devices which utilize these phenomena for exhibiting switching capabilities, it is required to effectuate the phenomena causing the switching capabilities in the temperature range at or above room temperature (e.g., 300 K or above). However, the switching capabilities disclosed in Patent Documents 1 to 3 are all confirmed at a low temperature such as at or below the liquid nitrogen temperature (77 K). The perovskite-type manganese oxide disclosed in these Patent Documents is a laminate in which, provided that the chemical composition is designated as $ABO_3$, atomic layers are repeatedly stacked such as an AO layer, a $BO_2$ layer, an AO layer and so on. The crystal structure of such a laminate is herein represented as AO—$BO_2$-AO. In the perovskite unit cell, A site, B site and O (oxygen) respectively occupy the vertex, the body centre and the face centre. Manganese is located at the B site.

In Patent Documents 1 to 3, the type of the element or ion which occupies the A sites of the perovskite crystal structure is considered to be involved in a decrease in the temperature at which the switching phenomenon is observed, i.e., at which the charge-orbital ordering appear in the perovskite-type manganese oxide (hereinafter referred to as "appearance temperature"). Simply stated, the appearance temperature is decreased because of the random occupation of the A sites of the perovskite crystal structure by cations of trivalent rare earth (hereinafter designated as "R") and divalent alkaline earth ("Ae"). To the contrary, it is also known that the transition temperature to the charge-ordered phase can be raised to about 500 K if the elements or ions at the A sites are ordered to be AeO—$BO_2$—RO—$BO_2$-AeO—$BO_2$—RO—$BO_2$— . . . . Hereinafter "A site ordering" refers to a regular arrangement of ions at A sites such as those disclosed herein and "A-site ordered perovskite-type manganese oxide" refers to the perovskite-type manganese oxide with A site ordering. A group of materials which exhibits such a high transition temperature is characterized in that the materials contain Ba (barium) as an alkaline earth (Ae). It has been reported that, for example, the oxides containing Ba as an alkaline earth (Ae) and Y (yttrium), Ho (holmium), Dy (dysprosium), Tb (terbium), Gd (gadolinium), Eu (europium) or Sm (samarium), which have lower ionic radii, as a rare earth element (R) have the transition temperature above room temperature.

In order to effectuate devices such as electronic devices, e.g., magnetic devices as well as optical devices which utilize these phenomena, it is required to prepare the perovskite-type manganese oxide in a thin film form and effectuate the switching phenomenon. However, there has been a problem such that the switching capabilities are difficult to be obtained when the thin film is formed on a (100)-oriented substrate, because the lattice deformation referred to as Jahn-Teller mode which is required for phase transition to the charge-ordered phase or the orbital-ordered phase is suppressed due to the in-plane 4-fold symmetry.

On the other hand, Japanese Patent Application Laid-open No. 2005-213078 (Patent Document 4) discloses the formation of a perovskite oxide thin film utilizing a (110)-oriented substrate. According to the disclosure of Patent Document 4, when the in-plane 4-fold symmetry is broken in the (110)-oriented substrate, shear deformation of the crystal lattice is permitted upon switching of the formed thin film. When shear deformation occurs, the crystal lattices are oriented parallel to the substrate plane while the charge-ordered plane or the orbital-ordered plane is non-parallel to the plane of substrate surface. Japanese Patent Application Laid-open No. 2008-156188 (Patent Document 5) also discloses an example of the A-site ordered perovskite-type manganese oxide which is in the form of a thin film. This disclosure reports an application and light irradiation method in which, once an amorphous thin film is deposited, laser annealing is carried out for crystallization and A-site ordering. It is actually confirmed by electron diffraction that A-sites are in order in a $SmBaMn_2O_6$ thin film formed on a (100)-oriented $SrTiO_3$ substrate (lattice constant: 0.3905 nm).

However, the A-site ordered perovskite-type manganese oxide has a problem in that the degree of A site ions order significantly affects the temperature at which the switching phenomenon is effectuated, i.e., the appearance temperature of charge-orbital ordering. Particularly in case of a thin film of the A-site ordered perovskite-type manganese oxide, the degree of A site ion order may be reduced even with an introduction of defects in the formed thin film or a slight departure in the composition of the thin film. Moreover, the thin film on the (110)-oriented substrate reported in Patent Document 4 has such a problem that it does not contribute to any of reduction in the degree of order and reduction in the appearance temperature. Thus conventional perovskite-type oxide thin films have unsolved problems regarding the low appearance temperature of charge-orbital ordering and the appearance temperature of charge-orbital ordering that is at or above room temperature depending on the degree of A site order and the resulting instability.

SUMMARY OF THE INVENTION

The present invention has been accomplished in view of the above concerns. The present invention provides a manganese oxide thin film and an oxide laminate which exhibit switching capabilities by controlling phase transition with an external stimulation (external field) at room temperature, in order to contribute to creation of novel devices.

As a result of investigation towards the above concerns, the present inventor assumed that the above issues are, first of all, caused by the fact that the A sites of the perovskite-type Mn oxide are occupied by two types of cations, i.e., cations of a trivalent rare earth element (R) and a divalent alkaline earth element (Ae, e.g. Sr or Ba). The present inventor came to the idea that the approach in which the perovskite-type Mn oxide is used in which two types of cations occupy the A sites cannot solve the above problems and thus investigated a different approach, thereby finding a specific means for solving the above problems.

The present invention solves at least one of the above problems based on a completely new principle. As the specific means for solving the problems, an aspect of the present invention provides a manganese oxide thin film formed on a plane of a substrate and having a composition represented by a composition formula $RMnO_3$, where R is at least one trivalent rare earth element selected from lanthanoids, and where both R and Mn form the same atomic layer parallel to the plane of the substrate.

The manganese oxide thin film of the present aspect is a thin film made of perovskite-type manganese oxide. The manganese oxide has a crystal lattice having a composition represented by $ABO_3$. The crystal of the manganese oxide thin film of the present aspect contains, as conventional perovskite-type crystals, Mn (manganese) at the B sites and has oxygen octahedrons surrounding Mn. In the crystal of the manganese oxide thin film of the present aspect, the A sites are occupied only by cations of the trivalent rare earth element (R). Thus, contrary to the conventional crystals, no divalent alkaline earth (Ae) is located at the A sites. The rare earth element R of the present aspect is typically a lanthanoid trivalent rare earth element, i.e., at least one element selected from the group consisting of La (lanthanum), Ce (cerium), Pr (praseodymium), Nd (neodymium), Pm (promethium), Sm, Eu, Gd, Tb, Dy, Ho, Er (erbium), Tm (thulium), Yb (ytterbium) and Lu (lutetium).

The substances disclosed in Patent Documents 4 and 5 have divalent alkaline earth (Ae) elements such as Sr (Patent Document 4) or Ba (Patent Document 5) at the A sites.

Moreover, in the manganese oxide thin film of the aspect of the present invention, both elements R and Mn form the same atomic layer parallel to the plane of the substrate. According to this configuration, shear deformation in the crystal lattice of the manganese oxide is permitted. According to the disclosure of Patent Document 5, because of the use of the (100)-oriented $SrTiO_3$ substrate, the crystal lattice of the $SmBaMn_2O_6$ thin film formed on the substrate has 4-fold symmetry which does not permit shear deformation.

The electronic phase of the manganese oxide which is a material of the thin film of the aspect of the present invention exhibits such a property that it undergoes phase transition between insulator and metal, namely Mott transition. Such manganese oxide is a member of a group of substances which are generally referred to as Mott insulators. However, the manganese oxide thin film of the present application is a thin film which exhibits a property that can undergo metal-insulator transition, and does not always have the insulator phase. Such a material is hereinafter referred to as "manganese oxide". Not only temperature but also an external stimulation (hereinafter referred to as "external field") may be generally involved in Mott transition. In a Mott transition which is generated only by temperature without application of an external field, the insulator phase and the metallic phase respectively appear in low and high temperature ranges. On the other hand, in a Mott transition which is generated at a certain temperature with an altered external field, the insulator phase and the metallic phase respectively appear in the ranges with weak and strong external fields. The manganese oxide thin film of the aspect of the present invention can undergo a Mott transition at room temperature (e.g., 300 K) with an external field. This means in the above aspect either that the transition temperature of Mott transition is decreased that is otherwise higher than a room temperature in general or that a threshold of an external field required for Mott transition is reduced than the conventional threshold, or both. The external field herein typically includes magnetic field, electric field, electric current, light, pressure and any combinations thereof.

According to an aspect of the present invention, the manganese oxide thin film according to the above aspect is provided wherein the composition of the manganese oxide thin film is represented by the composition formula $RMnO_3$, where R is at least one trivalent rare earth element selected from the group consisting of La, Ce, Pr, Nd, Pm, Sm, Eu, Gd, Tb and Dy.

The above group of the trivalent rare earth elements corresponds to a group of lanthanoid elements in order of atomic number excluding the elements Ho and thereafter. The trivalent rare earth element selected from the above group is advantageous because the degree of rotation of the oxygen octahedron can be controlled and thus the degree of exhibition of orbital ordering can be adjusted.

According to an aspect of the present invention, the manganese oxide thin film according to the above aspect is provided wherein the composition of the manganese oxide thin film is represented by composition formula $RMnO_3$, where R is at least two trivalent rare earth elements selected from the group consisting of La, Ce, Pr, Nd, Pm, Sm, Eu, Gd, Tb and Dy.

The cation of the trivalent rare earth element R is not necessarily of one type in the composition formula $RMnO_3$ of the manganese oxide thin film of the present invention. Namely, the chemical composition of the composition which is manganese oxide of the present aspect represented by $RMnO_3$ where two trivalent rare earth elements are used as the element R can alternatively represented by $(R_1MnO_3)_X$ $(R_2MnO_3)_{1-X}$, wherein $R_1$ and $R_2$ respectively represent distinct rare earth elements that can provide trivalent cations and $0<X<1$. The composition expressed as above is typically a solid solution which contains the manganese oxide $R_1MnO_3$ containing the rare earth element $R_1$ and the manganese oxide $R_2MnO_3$ containing the rare earth element $R_2$ at an arbitrary ratio of X:1-X. In any case regardless of the expressions, the problems resulting from variation in the degree of order in the crystal of the manganese oxide thin film are in principle solved in the present aspect, because only the cations of the trivalent rare earth elements are located at the A sites.

In the manganese oxide thin film of the present aspect, the trivalent rare earth element R comprises multiple elements having different ionic radii. This affects the rotation of the oxygen octahedron in the crystal structure, leading to two effects. One of the effects is such that the average lattice constant of the crystal lattice of the manganese oxide formed into a thin film can be altered. The other effect is such that a variation (randomness) is introduced to the rotation angle of the oxygen octahedron of the crystal lattice of the manganese oxide. Both of these act so as to reduce the threshold of an external field for Mott transition. Therefore use of multiple rare earth elements R is a preferable aspect. The same is true for the use of three or more trivalent rare earth elements R. These mechanisms are described in detail below in the section "1-5. Two effects of multiple elements R".

According to an aspect of the present invention, the manganese oxide thin film according to the above aspect is provided wherein a material forming the manganese oxide thin film has, as a bulk substance, the cubic root of the unit cell volume of the crystal lattice that is lower than the lattice constant of the crystal lattice of the substrate.

According to this aspect, the orbital ordered plane is disposed diagonally to the plane of the substrate and tensile strain is applied to the manganese oxide thin film. As a result, the angle of the bond Mn—O—Mn in the crystal lattice of the manganese oxide is increased to approach to 180 degrees. Because of this, increased carrier transfer in Mn—O—Mn, allows easy switching from the insulator phase to the metallic phase in Mott transition. This may cause such an effect that, when Mott transition is generated by means of an external field, the intensity of the external field required for Mott transition can be decreased.

In addition, according to an aspect of the present invention, the manganese oxide thin film according to the above aspect is provided wherein the orientation of the substrate is (110) orientation.

According to this aspect, epitaxial growth utilizing the atomic stacked plane of the substrate can be carried out, allowing a single crystal thin film without defects such as misfit.

Further, an aspect of the present invention also provides an oxide laminate which includes an additional layer. Namely in an aspect of the present invention is provided an oxide laminate including: the manganese oxide thin film according to any of the above aspects; and a strongly-correlated oxide thin film contiguous to the manganese oxide thin film, wherein the total thickness t of the oxide laminate, the thickness tm of the manganese oxide thin film and the thickness t1 of the strongly-correlated oxide thin film satisfy the following relation relative to the critical thickness tc under which the strongly-correlated oxide thin film is to be a metallic phase:

$$t=tm+t1>tc \text{ and } t1<tc.$$

In the oxide laminate of the present aspect, the strongly-correlated oxide thin film is disposed so as to be contiguous to and stacked with the manganese oxide thin film. The crystal structure of a material forming the strongly-correlated oxide thin film is of perovskite represented by $ABO_3$ similar to the manganese oxide thin film. However, different from the manganese oxide thin film, the A sites of the crystal lattice of the strongly-correlated oxide thin film are not always occupied only by cations of a trivalent rare earth element (R). The oxide laminate of the present aspect allows easier detection of switching capabilities of the manganese oxide thin film due to insulator-metal transition (Mott transition) compared to the above manganese oxide thin film alone, because the switching capabilities of the manganese oxide thin film due to insulator-metal transition (Mott transition), i.e., the change in the electron status, can be easily detected externally as, for example, the change in resistance of an oxide laminate specimen. The mechanism for this facilitation of detection may be referred to as dimensional crossover and is described below in detail in the section "1-7. Improvement in detectability by stacking (dimensional crossover)". It is further possible, as a result of the facilitation of detection, to secondarily decrease the threshold of an external field required for transition. This is partly because the thickness of the manganese oxide thin film undergoing Mott transition can be decreased compared to the case of the manganese oxide thin film alone.

An aspect of the present invention also provides an oxide laminate including: the manganese oxide thin film according to any of the above aspects; a first strongly-correlated oxide thin film contiguous to one surface of the manganese oxide thin film; and a second strongly-correlated oxide thin film contiguous to another surface of the manganese oxide thin film, wherein the total thickness t of the oxide laminate, the thickness tm of the manganese oxide thin film and thicknesses t1 and t2 respectively of the first and second strongly-correlated oxide thin films satisfy the following relation relative to the critical thickness tc under which the strongly-correlated oxide thin film is to be a metallic phase: t=tm+t1+t2>tc and max (t1, t2)<tc, where max (t1, t2) is the function which returns the maximum value among variables.

In the oxide laminate of the present aspect, the strongly-correlated oxide thin films are disposed so as to be contiguous to both surfaces of the manganese oxide thin film. The effect obtained by contacting the strongly-correlated oxide thin film can be further significantly enhanced compared to the case where the strongly-correlated oxide thin film is provided only at one surface.

The manganese oxide thin film or the oxide laminate of any aspects of the present invention contains a rare earth element(s) R having a constant valence of +3 at the A sites, with both elements R and Mn forming an atomic layer that is parallel to the plane of the substrate, whereby, in principle, the influence of variation in the degree of order will no longer be exhibited and Mott transition control can be implemented by an external field at room temperature.

BRIEF DESCRIPTION OF THE DRAWINGS

FIG. 1 is a schematic section view of a manganese oxide thin film of an embodiment of the present invention in which

FIG. 2 is a schematic section view showing an exemplary configuration of an oxide laminate containing a manganese oxide thin film prepared so as to contact with a strongly-correlated oxide thin film of an embodiment of the present invention in which

FIG. 5 is an illustration view showing the angle of Mn—O—Mn in a manganese oxide thin film of an embodiment of the present invention.

DETAILED DESCRIPTION OF THE INVENTION

Figure 1A:
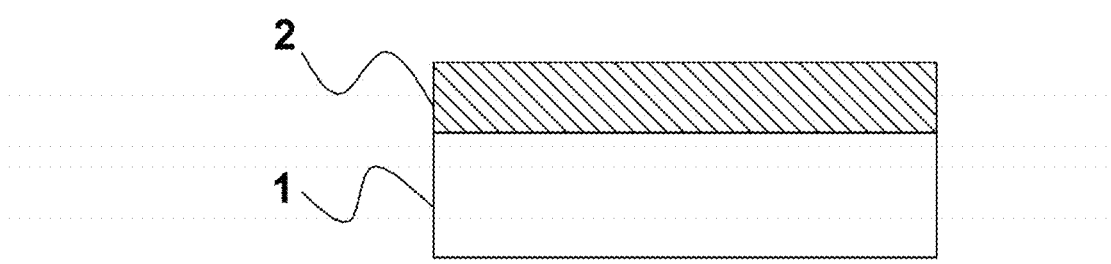
FIG. 1A is an overall view showing the configurations of the manganese oxide thin film formed on a substrate and FIG. 1B is an enlarged view showing atomic stacked planes of the manganese oxide thin film (section view)

The embodiments of the manganese oxide thin film and the oxide laminate according to the present invention are hereinafter described by referring to the drawings. In the following descriptions, common parts or elements in all figures are designated by common reference numerals unless otherwise stated. The respective elements in the embodiments are not necessarily depicted to scale.

First Embodiment

1. Basic Principle

1-1. Facilitation of Mott Transition in a Manganese Oxide Thin Film

An embodiment of the manganese oxide thin film according to the present invention is hereinafter described based on the drawings. First, a basic principle for providing switching capabilities at room temperature, i.e., a basic principle for effectuating Mott transition in the manganese oxide thin film at room temperature by means of an external field is explained. Generally, the manganese oxide thin film has an extremely higher orbital ordering temperature than that of A-site ordered Mn oxides and the like. For example, $PrMnO_3$ has the orbital ordering temperature of as high as 1000 K or higher. Namely, the manganese oxide thin film at room temperature of about 300 K, for example, is in the orbital ordered state. This is one of important points to be acknowledged.

Figure 5A:
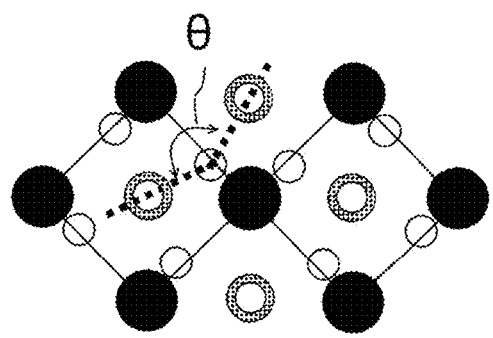
FIG. 5(a) shows the state where, in the crystal lattice, the oxygen octahedron is deformed in the direction of the rotation, so that the angle of Mn—O—Mn is lower than 180 degrees.
Figure 5B:
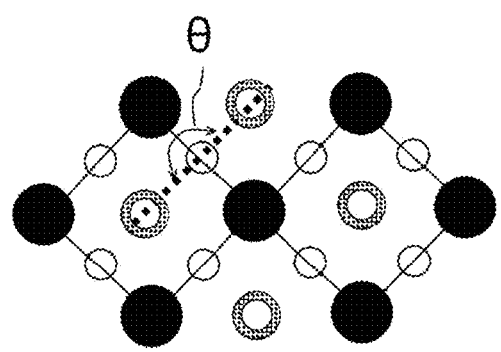
FIG. 5(b) shows the state where, in the crystal lattice, the oxygen octahedron is deformed in the direction of the rotation due to tensile strain from the substrate, so that the angle of Mn—O—Mn is increased.

In the present example, the element at the site of Pr (A site) of $PrMnO_3$ is now replaced by the elements in order of lanthanoid such as La, Ce, Pr, Nd, Pm, Sm, Eu, Gd, Tb, Dy, Ho, Er, Tm, Yb and Lu. The above order of lanthanoid is so-called "Lanthanide contraction" and represents the descending order of ionic radius. When the element at the A site is replaced with sequentially from La, the orbital ordering temperature of the manganese oxide thin films increases while the antiferromagnetic transition temperature decreases. This tendency continues up to Dy. When the element is replaced with the following Ho, the orbital ordering temperature drops compared to Dy and the antiferromagnetic transition temperature starts to increase again. In this case, the oxygen octahedron surrounding Mn is deformed so as to have a $GdFeO_3$ type distorted structure, namely so as to be rotated in the crystal lattice without deforming the lattice of the A sites. The degree of this translocation or rotating deformation increases while replacing lanthanoid from La to Ho in this order. When replacing the elements within the range from Er to Lu, the crystal structure of a bulk substance is likely to be hexagonal rather than orthorhombic because the ionic radius is further decreased. However, in the form of a thin film, the orthorhombic structure can be achieved by allowing epitaxial growth on a cubic perovskite-type substrate. Therefore all elements of lanthanoid can be employed as the elements to be replaced at the A sites. As a result, the angle θ of Mn—O—Mn (FIG. 5) decreases during replacement of the elements in this order. FIG. 5 is an illustration view showing the angle of Mn—O—Mn in the manganese oxide thin film of the present embodiment. FIG. 5(a) shows the state where the crystal lattice is deformed in the direction of rotation of the oxygen octahedron, so that the angle of Mn—O—Mn is lower than 180 degrees and FIG. 5(b) shows the state where the crystal lattice is deformed in the direction of rotation of the oxygen octahedron due to tensile strain from the substrate, so that the angle θ of Mn—O—Mn is increased. The angle θ which is lower than 180 degrees affects the band width, which is an indicator of conductivity of carriers, so as to deteriorate the conductivity, because the angle θ significantly affects the degeneracy between the 2p orbital of $O^{2-}$ and the $e_g$ orbital that is generated by crystal field splitting of the 3d orbital of $Mn^{3+}$.

Thus the present inventor believes that the lanthanoid elements excluding Ho and thereafter, i.e., La, Ce, Pr, Nd, Pm, Sm, Eu, Gd, Tb and Dy allow the orbital ordering governed by the same physical mechanism. Within the range of the elements, the liability of the appearance of the orbital ordering, as the antiferromagnetic transition temperature, systematically depends on the ionic radius.

Next, the reason for one of the phenomena described above in the section of Background Art as problems, i.e., the reason why the temperature of insulator-metal transition by an external field remains low is now described. This phenomenon occurs because, simply stated, the order of the electronic phase is too "robust" to transit the electronic phase of manganese oxide to the metallic phase by applying an external field that is generally available. Namely, the threshold of an external field required to decrease the order of the electronic phase in manganese oxide to obtain the metallic phase is extremely high. When reviewing conventional approaches in light of the above, the understanding of the principle which has been conventionally relied on can be facilitated. Namely, in manganese oxide which could otherwise be a metal according to the band theory but is a Mott insulator due to the electron correlation, the conventional principle is employed such that the above "robustness" is decreased by doping holes so as to intentionally weaken the electron correlation. Actually, all conventional modes for controlling Mott transition by external fields rely on this principle. However, as far as relying on this principle, a trade-off cannot be avoided such that the orbital ordering temperature and the charge-orbital ordering temperature are below room temperature. The fact is that the conventional approaches could not overcome this trade-off.

In light of this situation, the present inventor raised the question as to which mechanism governs the robustness of the order of the electron system in Mott insulators such as manganese oxide. While trying to address this question, the present inventor came up with a hypothesis that the robustness of the orbital ordering is caused by cooperative phenomena and depends on the number of electron orbitals. If this hypothesis is correct, the above trade-off could be highly possibly addressed even for manganese oxide, which has a too "robust" electron system to be addressed in the form of a bulk crystal, only when manganese oxide is formed into a thin film and the number of orbitals is sufficiently reduced. Thus, the present inventor reached the idea that when manganese oxide is made into the form of a thin film, the above "robustness" could be reduced to such a degree that the "robustness" could be controlled by external fields. This concept provided the idea for the present invention.

With regard to the probability of the above hypothesis, experimental descriptions are provided in Examples hereinbelow. The additional theoretical description supporting the above hypothesis is now provided. The phenomena observed in a strongly-correlated electron system such as charge ordering and orbital ordering are cooperative phenomena and aspects of the many-body effect in substances having high electron correlation effect. Namely, when only one unit cell is a subject that contains only one $Mn^{3+}$ ion having the 3d orbital, the definition of charge or electron orbital ordering is not applicable. Therefore the electron status of the system containing two unit cells in series is considered. In this case, the state of the electron orbital of one unit cell (orbital state) and the orbital state of the other unit cell are in a competitive state. Thus the orbital ordered state is achieved if the system is more stable with the ordered electron orbitals and the orbital ordered state collapses if the system is more stable without the ordered electron orbitals. Actually, there is a possibility that the energy difference between these two states, i.e., the state where the orbital ordered state is achieved and the state where the orbital ordered state collapses, may be too low to render the system of two unit cells to take either of the states. Therefore it is not pronounced that the orbital ordering is reached for the electron state of the system containing two unit cells in series.

Meanwhile, a system is considered which contains N unit cells (N is an integer which is sufficiently bigger than 2). In this case, compared to the state where the orbital of only one unit cell among N unit cells is different from the orbitals of N−1 unit cells, it is more stable that all orbitals in N unit cells are ordered. Thus the surrounding N−1 unit cells produce interaction with one unit cell so as to order the different orbital. Further, even compared to the state where the orbitals of a few unit cells among N unit cells are different from other unit cells, it is more stable that all orbitals in N unit cells are ordered. Accordingly, in the system containing N unit cells that is sufficiently bigger than 2, the interaction is produced between the orbitals of unit cells so as to order all orbitals and thus the whole system is stabilized.

It is revealed from the above properties of two unit cells and N unit cells that the stability of the electron system depends on the size of the electron system, namely the number of unit cells. Again, both charge ordering and orbital ordering are derived from cooperative phenomena in substances having a strong electron correlation, and thus the orderings are said to be products of self assembly of electrons. Therefore the fact that the number of unit cells is high plays a substantial role for charge ordering and orbital ordering. Thus the above hypothesis that the robustness in the orbital ordering which is a cooperative phenomenon depends on the number of the electron orbitals is theoretically and sufficiently reasonable.

1-2. Selection of Crystal Structure

Figure 1B:
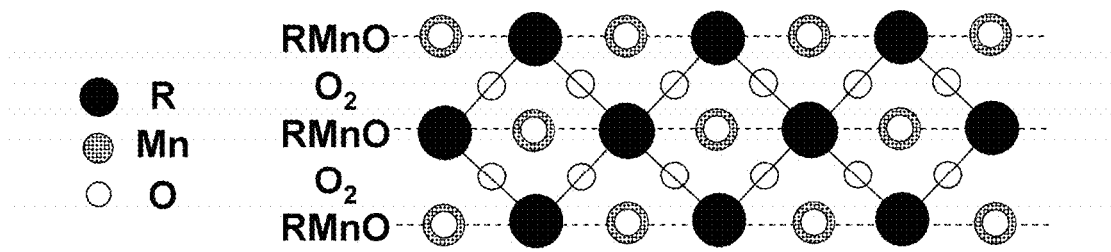

In order to allow switching capabilities in manganese oxide thin films, in addition to reduction of the threshold of external fields for allowing switching capabilities, the fact that Mott transition is a first order phase transition (first order transition) is taken into account. Thus the manganese oxide of the present embodiment employs the crystallite symmetry that permits shear deformation, so that it is not an obstacle to the Jahn-Teller mode transition. More specifically, the manganese oxide thin film of the present embodiment has the crystal structure which comprises atomic stacked planes of alternate RMnO layers and $O_2$ layers stacked in the direction perpendicular to the plane of the substrate, i.e., the crystal structure where the layers are stacked as RMnO—$O_2$—RMnO . . . FIG. 1 is a schematic section view of the manganese oxide thin film of the present embodiment. FIG. 1(a) is an overall view showing the configurations of the manganese oxide thin film formed on a substrate and FIG. 1(b) is an enlarged view of atomic stacked planes of the manganese oxide thin film (section view). FIG. 1(b) shows the crystal structure of the manganese oxide thin film sectioned at a plane perpendicular to the plane of the substrate. In this crystal structure, the in-plane 4-fold symmetry is broken to be converted to 2-fold symmetry and as a result, insulator-metal transition of Mott transition can be exhibited.

In the crystal structure containing atomic stacked planes where RMnO layers and $O_2$ layers are stacked alternately, RMnO atomic layers are, as shown in FIG. 1(b), disposed so as to form atomic layers parallel to the plane of the substrate (not shown in FIG. 1(b)) which extends along the horizontal direction on the plane of paper. In other words, in this crystal structure, both elements R and Mn form the same atomic layer parallel to the plane of the substrate. Particularly, FIG. 1(b) exemplifies the case where the crystal structure of the perovskite structure of the manganese oxide thin film represented by the composition formula $RMnO_3$ is cubic. However, the material of the manganese oxide thin layer of the present embodiment, i.e., manganese oxide having the perovskite structure and represented by the composition formula $RMnO_3$ may have the perovskite structure in the crystal structure with the crystal lattice other than cubic, i.e., only with a lower order symmetry such as tetragonal, orthorhombic, monoclinic, triclinic, trigonal and hexagonal. This is because in any of these cases, shear deformation is permitted when both elements R and Mn form the same atomic layer parallel to the plane of the substrate as the manganese oxide thin film of the present embodiment. The perovskite structure of the present embodiment encompasses substances having a crystal structure such that only a plurality of unit cells connected in series can provide the fundamental unit lattice of the crystal lattice as described above. The crystal structure shown in FIG. 1(b) can be confirmed by identification of crystallographic point groups according to well known X-ray diffraction. Particularly the fact that both elements R and Mn form the same atomic layer parallel to the plane of the substrate can be confirmed by direct observation of atoms with a STEM (scanning transmission electron microscope).

1-3. Selection of Substrate

One typical procedure for forming a manganese oxide thin film in which both elements R and Mn form the same atomic layer parallel to the plane of a substrate is to employ a (110)-oriented substrate as the substrate 1. In this case, the crystal structure shown in FIG. 1(*b*) can be formed by forming the crystal structure of the manganese oxide thin film having the composition formula $RMnO_3$ so as to be coherent relative to the crystal of the substrate 1.

1-4. Utilization of Substrate Strain

Figure 4:
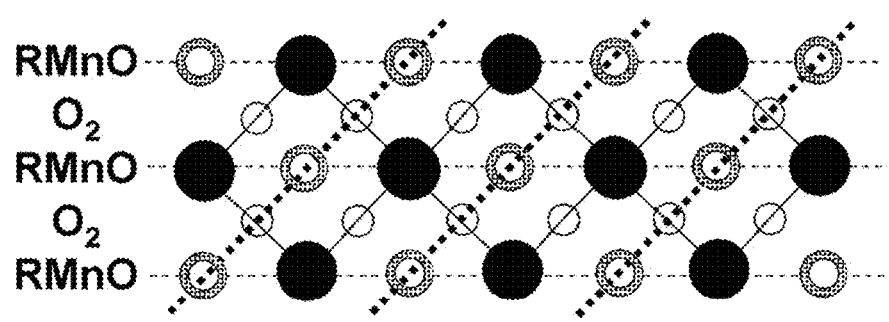
FIG. 4 is an illustration view showing that the orbital ordered plane in a manganese oxide thin film of an embodiment of the present invention is the (100) plane.

In the present embodiment, transition to the metallic phase can be facilitated by utilizing strain applied to the manganese oxide thin film 2 from the substrate 1. This mechanism involves the disposition of the oxygen octahedron surrounding Mn in manganese oxide, a Mott insulator, represented by the composition $RMnO_3$. As described above, the oxygen octahedron is accompanied by the $GdFeO_3$ type distorted structure (gradient translocation or rotation deformation). However, the deformation of the oxygen octahedron can be reduced by applying tensile strain resulting from substrate strain to manganese oxide of the manganese oxide thin film 2. In order to reduce the deformation, a specific combination of the compositions of manganese oxide and the substrate 1 may be selected so as to obtain the cubic root of the unit cell volume in a bulk substance of manganese oxide undergoing Mott transition that is lower than the lattice constant of the substrate 1. Thereby the orbital ordered plane can be obtained which is the (100) plane, namely is inclined at about 45 degrees relative to the plane of the substrate. FIG. 4 is an illustration view showing that in the manganese oxide thin film of the present embodiment, the orbital ordered planes shown with chained lines are the (100) planes. In this configuration, substrate strain acts so as to bring the angle of Mn—O—Mn towards linear (180 degrees), namely increase the band width of the carriers. The difference is shown in FIG. 5(*b*) in comparison with the state before receiving the action of the substrate strain (FIG. 5(*a*)). As a result, the external field required for switching can be reduced for the increased amount of the band width.

1-5. Two Effects of Multiple Elements R

As described above, the element R may be not only one but also multiple trivalent rare earth elements selected from the group consisting of La, Ce, Pr, Nd, Pm, Sm, Eu, Gd, Tb and Dy. When two trivalent rare earth elements are used as R, for example, the composition of manganese oxide represented by $RMnO_3$ of the above aspect also encompasses the composition represented by $(R_1MnO_3)_X(R_2MnO_3)_{1-X}$, wherein $R_1$ and $R_2$ respectively represent distinct rare earth elements that can provide trivalent cations and 0<X<1. The composition expressed as above is, as described above, a solid solution which contains the manganese oxide $R_1MnO_3$ containing the rare earth element $R_1$ and the manganese oxide $R_2MnO_3$ containing the rare earth element $R_2$ at an arbitrary ratio of X:1-X. By employing multiple trivalent rare earth elements R, there are multiple ionic radii of cations located at the A sites in manganese oxide. This affects the rotation of the oxygen octahedron, resulting in two effects.

1-5-1. Adjustment of Lattice Constant by Means of Differential Ionic Radii

The first effect is adjustment of the lattice constant of manganese oxide. In other words, it may be the modulation of the lattice constant of manganese oxide by the ratio among multiple rare earth elements R. The lattice constant of manganese oxide having the composition formula $(R_1MnO_3)_X(R_2MnO_3)_{1-X}$ is, in average, a weighted average obtained from the lattice constants of the respective crystal lattices of the manganese oxide $R_1MnO_3$ containing the rare earth element $R_1$ and the manganese oxide $R_2MnO_3$ containing the rare earth element $R_2$ in consideration of the composition ratio X:1-X. In this case, $R_1$ and $R_2$ are selected from La, Ce, Pr, Nd, Pm, Sm, Eu, Gd, Tb and Dy so as to have different ionic radii each other. Accordingly, the lattice constant such as the cubic root of the unit cell volume described in the section "1-4. Utilization of substrate strain" can be adjusted as an average. Thus the lattice constant of manganese oxide can be determined by averaging various ionic radii of multiple elements R, resulting in adjustment of strain applied from the substrate 1 to manganese oxide in the form of a thin film. As a result, during gradient translocation or rotation deformation of the $GdFeO_3$ type, deformation of the oxygen octahedron can be reduced. Namely, the action of the substrate strain which affects the angle of Mn—O—Mn can be modulated by employing multiple rare earth elements R, resulting in reduction of the threshold of an external field required for Mott transition.

1-5-2. Randomness Introduced to Rotational Angle of Oxygen Octahedron

Figure 6:
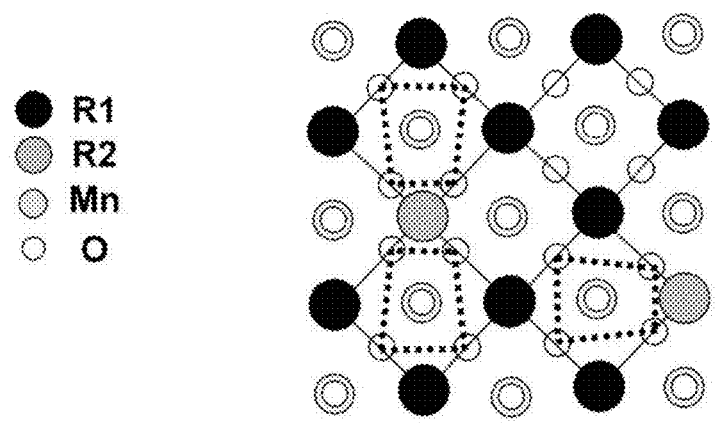
FIG. 6 is a schematic view showing, in a manganese oxide thin film of an embodiment of the present invention, the difference in strain of oxygen octahedrons in the crystal structure where two lanthanoid elements $R_1$ and $R_2$ having different ionic radii are randomly arranged.

The second effect results from the phenomenon such that the rotational angles of the oxygen octahedrons in crystal lattices are varied when multiple rare earth elements R are located depending on the positions thereof. It can be said that multiple rare earth elements R are located in order to intentionally introduce the variation in the crystal lattices. FIG. 6 is a schematic view showing, in the manganese oxide thin film 2, the difference in strain of oxygen octahedrons in the crystal structure where two lanthanoid elements $R_1$ and $R_2$ having different ionic radii are randomly located. In this figure, for simplification, the positions of cations are fixed at the cubic configuration and change in the positions of oxygen atoms is shown. The deformation of the Jahn-Teller mode is the deformation of the oxygen octahedron surrounding Mn. Therefore, as shown with chained lines in FIG. 6, oxygen atoms are affected by whether the nearby lanthanoid is $R_1$ or $R_2$. As a result, the carriers (electrons) are affected by the fluctuated angle of Mn—O—Mn during passing through a number of crystal lattices. The fluctuation leads to reduction in the threshold of an external field required for Mott transition. Two experimental facts and theoretical explanations for helping understanding of the relationship between the fluctuation and Mott transition are added hereinbelow.

1-5-2-1. First Experimental Fact

The first experimental fact is provided for a conventional perovskite manganese oxide in which atoms having different valences are randomly located at A sites. The perovskite manganese oxide having the composition $Pr_{0.5}Ca_{0.5}MnO_3$ is manganese oxide in which Pr and Ca respectively having the nominal valences of +3 and +2 randomly occupy the A sites.

The manganese oxide has checkerboard-like sequences of Mn with nominal valence of 3 and Mn with nominal valence of 4 in alternate manner within a crystal plane at or below 240 K, and shows a charge-orbital ordered insulating phase where electron orbitals are aligned. However, when the temperature is increased, manganese oxide is converted to the paramagnetic insulating phase. In this substance, the experimental fact is known that when Mn having nominal valence of +4 is replaced by chemically stable Cr with nominal valence of 3, the charge-orbital ordered insulating phase is facilitated to be degraded and the metallic phase is facilitated to be exhibited. This is the first experimental fact. Trivalent Cr randomly replacing the positions of Mn can be regarded as quadrivalent Mn of which site is fixed. The phenomenon relating to manganese oxide exhibiting the charge-orbital ordered insulating phase can be explained to be occurred because the randomness introduced at the B sites after replacement of $Mn^{4+}$ with $Cr^{3+}$ prevents a long distance order of the charge-orbital ordered phase and a ferromagnetic metallic phase in the charge-orbital ordered phase is generated to facilitate transition of the electron system to the metallic phase.

1-5-2-2. Second Experimental Fact

The second experimental fact is a phenomenon which is more directly observed when the randomness is decreased in the conventional A site order. The perovskite manganese oxide represented by the composition formula $Sm_{0.5}Ba_{0.5}MnO_3$ is known to have two crystal structures. One structure has the A site order and the other does not. In the crystal system with (100) orientation has the series of atomic layers in the former lattice structure represented by $BaO_2$—$MnO_2$—$SmO_2$—$MnO_2$—$BaO_2$—$MnO_2$— . . . while in the latter structure, it is $(Ba, Sm)O_2$—$MnO_2$—$(Ba, Sm)O_2$— . . . wherein $(Ba, Sm)O_2$ is an atomic layer where Ba and Sm randomly occupy the A sites. It is known that the former structure with the A site order has a higher temperature $T_{OO}$ at which the orbital ordered phase disappears than that of the latter structure without the A site order. This is the second experimental fact. This experimental fact means that the crystal structure corresponding to the A site order which decreases entropy directly increases the degree of order of the electron system. To the contrary, it can be said that the randomness introduced at the A sites has a direct effect to decrease the degree of order of the electron system.

1-5-2-3. Effect of Randomness to Electron System

According to the above first and second experimental facts and theoretical explanations that support these facts, the second effect, i.e., the effect of variation (randomness) introduced into the rotational angles of the oxygen octahedrons wherein multiple rare earth elements R are located can be at least qualitatively predicted. Namely, by intentionally introducing variation to the crystal lattices, the threshold of an external field required for Mott transition may be reduced. Particularly, by taking into account the strong relationship between the angle of Mn—O—Mn and the conduction band width of the carriers, the degree of the reduction in the threshold may be sufficiently observed, resulting in enhances utility thereof.

From the view point of the object for reducing the threshold of an external field for Mott transition, it is not always necessary to strictly differentiate the first effect from the second effect. When it is required to differentiate these effects by experimental confirmation, the following experiment may be carried out. Two kinds of manganese oxide are prepared; for example one contains one rare earth element (e.g. Sm) and the other contains two rare earth elements (e.g. Pr and Tb) with both having the same lattice constant (average lattice constant). The transition temperature and the threshold of the external field for Mott transition are then compared. Upon this comparison, the ratio between two rare earth elements Pr and Tb is adjusted to obtain the same lattice constant as the manganese oxide containing one rare earth element Sm, and then reduction in the transition temperature or threshold can be judged to be the result of contribution of the second effect.

1-5-3. Feasibility of Multiple Rare Earth Elements

Importantly, all elements in the element group of La, Ce, Pr, Nd, Pm, Sm, Eu, Gd, Tb and Dy have the stable valence of +3 with an exception of Ce, which also has the stable valence of +3 as one of the stable valences and therefore able to have the electron configuration as a trivalent cation. This means, among others, that the value X in the composition $(R_1MnO_3)_X$ $(R_2MnO_3)_{1-X}$ is not strictly limited as far as $R_1$ and $R_2$ are selected from the above range of rare earth elements. This applies to the composition of the thin film of manganese oxide as well as the composition of the target material for forming the thin film. The above-mentioned also means that the properties of the electron system of manganese oxide are not directly affected by the difference in charge or electron orbital which is different from the conventional cases where divalent cations affect the A site order in terms of electron orbitals. Based on the above properties, the rare earth elements $R_1$ and $R_2$ and the ratio X can be selected with mainly focusing to adjust the effect on the band width resulting from the difference in ionic radii and the resulting strain in the crystal structure and to adjust geometric properties of the crystal lattice such as matching of the lattice constant with the substrate 1 and introduction of the randomness. This circumstance similarly applies to not only where only two rare earth elements R are used but also where all combinations of two or more elements R selected from La, Ce, Pr, Nd, Pm, Sm, Eu, Gd, Tb and Dy are used.

1-6. External Detectability and Effectuation of Device Functionality

It is possible to detect whether any of the manganese oxide thin films provided by the present embodiment actually undergoes Mott transition by various analysis means. For example, the presence of transition can be measured by optical measurements or measurements of transmittance or reflectance as the change in the electron structure corresponding to the energy of probe light for measurements. Mott transition can also be detected as arbitrary physical quantities such as magnetic properties, deformation or electric resistance. The change in physical quantities can provide not only detectability of Mott transition but also material properties which are utilized as switching capabilities upon application of the manganese oxide thin film of the present embodiment to devices.

1-7. Improvement in Detectability by Stacking (Dimensional Crossover)

However, in some cases, external detection of the change in material properties may be difficult when Mott insulators such as manganese oxide are prepared in the form of a thin film as above. This problem may not always occur. When this problem occurs in relation to the Drude component, namely the direct current resistant component, which is represented by electron conductivity reflecting electric properties, it can be said that the carriers (electrons) are localized resulting from the low dimensionality of the system (two dimensionality in case of the thin film). In case of a thin film, for example, electrons may be localized at a portion of the two dimensional region to decrease conductivity. In order to address this problem, it is preferable to utilize a device called dimensional crossover in the present embodiment.

Figure 2A:
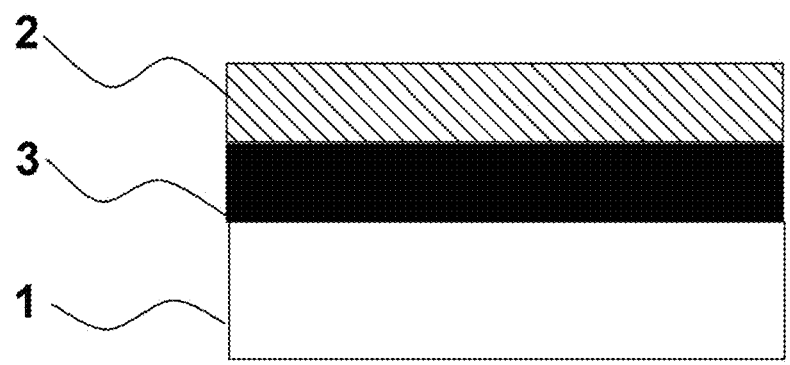
FIG. 2A shows an example that a strongly-correlated oxide thin film is formed on the manganese oxide thin film on the side of a substrate and FIG. 2B shows an example that a strongly-correlated oxide thin film is formed on the top surface of the manganese oxide thin film.
Figure 2B:
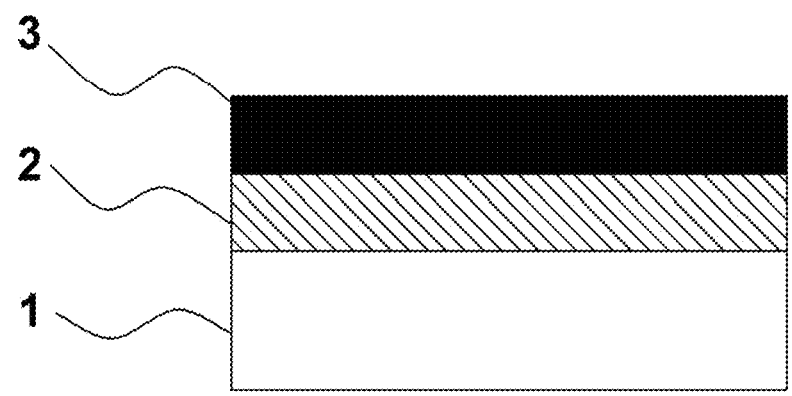

A thin film formed contiguously to the manganese oxide thin film, namely a strongly-correlated oxide thin film which is formed so as to be successive to the manganese oxide thin film is now described. The strongly-correlated oxide thin film is a layer which is different from manganese oxide undergoing Mott transition and is added to exploit dimensional crossover. In general, it is preferable that a strongly-correlated oxide thin film has a thickness higher than a certain level in order to stabilize the metallic phase or effectuate metal-insulator transition, because the strongly-correlated oxide thin film having an extremely low thickness may have difficulty in effectuating the stable metallic phase or metal-insulator transition. Thus when a strongly-correlated oxide thin film has a higher thickness than a certain critical thickness (hereinafter referred to as "critical thickness"), the strongly-correlated oxide can have the metallic phase or undergo metal-insulator transition. In this sense, the critical thickness may be regarded as the lower limit of the thickness of the strongly-correlated oxide in order to obtain the stable metallic phase or exhibit metal-insulator transition. The configuration of an oxide laminate in which the strongly-correlated oxide thin film and the manganese oxide thin film are formed contiguously or successively each other on a substrate is now reviewed. FIG. 2 is a schematic section view showing an exemplary configuration of the oxide laminate containing the manganese oxide thin film prepared contiguously to the strongly-correlated oxide thin film of the present embodiment. FIG. 2(a) shows an example of the strongly-correlated oxide thin film formed on the manganese oxide thin film on the side of the substrate and FIG. 2(b) shows an example of the strongly-correlated oxide thin film formed on the top surface of the manganese oxide thin film. The oxide laminate may encompass the configurations in which the strongly-correlated metal thin film is first formed on the plane of the substrate and then the manganese oxide thin film is formed thereon (FIG. 2(a)) and in which, conversely, the manganese oxide thin film is first formed on the plane of the substrate and then the strongly-correlated metal thin film is formed thereon (FIG. 2(b)). In this embodiment, the total thickness t of the oxide laminate, the thickness tm of the manganese oxide and the thickness t1 of the strongly-correlated oxide thin film satisfy the relation relative to the critical thickness tc of the metallic phase for the strongly-correlated oxide thin film of: $t=tm+t1>tc$ and $t1<tc$. For example, the critical thickness tc of a strongly-correlated oxide thin film (assumed to have the metallic phase at room temperature) of a ferromagnetic metal, a $La_{0.7}Sr_{0.3}MnO_3$ thin film, on the (110)-oriented substrate is 8 unit cells (about 4 nm).

When the layers are formed so as to satisfy the above relationship of the thickness, upon Mott transition corresponding to insulator-metal transition of manganese oxide by application of an external field, the carriers localized in the strongly-correlated oxide thin film feel the thickness of $t=tm+t1$ rather than t1 which had been felt, wherein t1 is less than tc and t exceeds tc. Thus when the manganese oxide thin film undergoes Mott transition and is changed from insulator to metal, the effect thereof is also reflected to the transition of the strongly-correlated oxide thin film, resulting in an improvement in detectability. This is the principle of dimensional crossover. By exploiting dimensional crossover, the change in electric resistance due to Mott transition can be extracted as electric current. Therefore even when the manganese oxide thin film is prepared, in order to realize the switching with a weak external field, so as to have a thickness less than the lower limit required for securing the detectability by electric current, the detection with electric current is possible with the aid of the strongly-correlated oxide thin film. The carriers in the Mott insulator of course have an effect for improving the detectability by enhancing the electric current.

Figure 3:
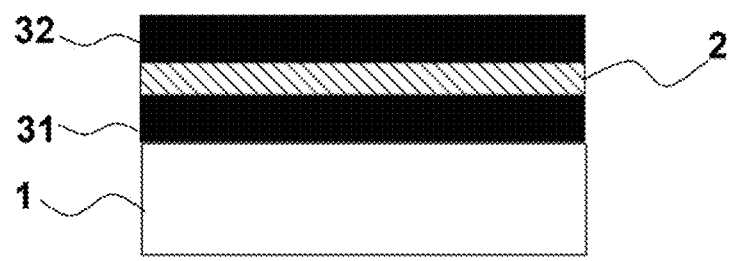
FIG. 3 is a schematic section view of an exemplary oxide laminate containing a manganese oxide thin film and strongly-correlated oxide thin films formed on both surfaces thereof in an embodiment of the present invention.

More preferably, in order to further effectively utilize dimensional crossover, the strongly-correlated oxide thin film is provided on both surfaces, instead of one surface, contiguously to the manganese oxide thin film to form the oxide laminate. FIG. 3 is a schematic section view of an exemplary oxide laminate containing a manganese oxide thin film and strongly-correlated oxide thin films contiguous to both surfaces thereof in the present embodiment. Namely, the total thickness t of the oxide laminate, the thickness tm of the manganese oxide thin film, the thickness t1 of the first strongly-correlated oxide thin film 31 and the thickness t2 of the second strongly-correlated oxide thin film 32 satisfy the relation relative to the critical thickness tc of the metallic phase for the strongly-correlated oxide thin film of: $t=tm+t1+t2>tc$ and $max(t1, t2)<tc$, wherein max( ) is the function which returns the maximum value among variables. When the oxide laminates are formed contiguously to both surfaces of the manganese oxide thin film, the effect by dimensional crossover is further effectively exhibited. Thus the thickness tm of the manganese oxide thin film can be further reduced compared to the case where the strongly-correlated oxide thin film is disposed only on one surface. Accordingly switching by a further weak external field can be realized.

2. EXAMPLES

The present embodiments are now described based on specific Examples. The materials, amount of use, proportion, processes, order of procedures, orientation of elements or members, specific dispositions and external fields employed for measurements and the like can be appropriately modified unless they depart from the scope of the present invention. Thus the scope of the invention is not limited to the following specific examples. The descriptions are made by further referring to FIGS. 2 and 3.

2-1. Example 1

Example 1 for the present embodiment is an example of an oxide laminate prepared to have the configurations shown in FIG. 3 comprising first and second strongly-correlated oxide thin films 31 and 32 contiguous to both surfaces of a manganese oxide thin film 2. The manganese oxide thin film 2 used was $SmMnO_3$, the first and second strongly-correlated oxide thin films 31 and 32 used were $La_{0.5}Sr_{0.5}MnO_3$ (hereinafter designated as LSMO) and the substrate 1 used was (110)-oriented $SrTiO_3$ (hereinafter designated as STO) substrate. The material of the manganese oxide thin film 2, $SmMnO_3$, has the cubic root of the unit cell volume as a bulk substance of 0.3889 nm which is lower than the lattice constant, 0.3905 nm, of STO of the substrate 1, and thus the orbital ordered plane in Example 1 is the (100) plane and it is expected that tensile strain may be applied to the manganese oxide thin film 2 from the substrate 1. The first and second strongly-correlated oxide thin films 31 and 32 were, instead of $La_{0.7}Sr_{0.3}MnO_3$ which has a similar composition as LSMO and has maximum Curie temperature $T_c$ (370 K), LSMO which has an increased amount of overdoped Sr. It is intended to increase the Curie temperature $T_c$ of the first and second strongly-correlated oxide thin films 31 and 32 by taking into account the carriers (electrons) supplied upon insulator-metal transition of the manganese oxide thin film 2.

The method for preparing the oxide laminate of Example 1 is first described. The manganese oxide thin film 2, the first and second strongly-correlated oxide thin films 31 and 32 were formed by laser ablation. Target materials for the respective thin films used were cylindrical moulded articles having φ 20 mm×5 mm of polycrystalline materials of the respective materials prepared by solid reaction. The STO (110) substrate was attached in a vacuum chamber which was then vacuum exhausted to $3\times10^{-9}$ Torr ($4\times10^{-7}$ Pa) or lower. Highly pure oxygen gas (1 mTorr (0.133 Pa)) was introduced to the chamber and the substrate was heated so as to reach the achieving temperature of 900° C. The LSMO target was irradiated with a KrF excimer laser having the wavelength of 248 nm introduced through a laser introduction port of the chamber to obtain the first strongly-correlated oxide thin film 31 corresponding to only 8 atomic layers of LSMO. The atomic layer herein corresponds to the one in which one atomic layer has the (110) plane distance d (110). The film thickness or the number of atomic layers was controlled according to the preliminary determination based on the relationship between the number of shots of laser pulse and the number of atomic layers. Subsequently in the same atmosphere, the $SmMnO_3$ target was irradiated with the laser through the port to obtain the manganese oxide thin film 2 corresponding to only 4 atomic layers of $SmMnO_3$. The LSMO target was again used to obtain the second strongly-correlated oxide thin film 32 corresponding to only 8 atomic layers of LSMO. The first strongly-correlated oxide thin film 31 has the thickness t1 of 4 unit cells (about 2.2 nm), the manganese oxide thin film 2 has the thickness tm of 2 unit cells (about 1.1 nm) and the second strongly-correlated oxide thin film 32 has the thickness t2 of 4 unit cells (about 2.2 nm). The oxide laminate has the total thickness t of 5.5 nm. The critical thickness tc of LSMO in the first and second strongly-correlated oxide thin films 31 and 32 required for LSMO being a metallic phase at room temperature (300 K) is 8 unit cells (4.3 nm). Thus the thicknesses of the layers in the oxide laminate prepared in the present Example satisfy the relationship of t=tm+t1+t2>tc and max(t1, t2)<tc.

The prepared oxide laminate containing the manganese oxide thin film 2 was provided with a 4-terminal electrode and magnetoresistance measurements were carried out at room temperature (300 K). The magnetic field was employed as the external field because the measurement is easy. In the measurements, the resistance value of the specimen started to decrease by application of a magnetic field having the magnetic flux density of 4.2 T or more and was decreased to 10 kΩ under a magnetic field of 4.8 T. Thus the huge negative magnetoresistant effect was confirmed. The subsequent reduction of the magnetic field resulted in restoration of the resistance of 10 MΩ or more, demonstrating that Mott transition corresponding to insulator-metal transition was exhibited in the manganese oxide 2 in the oxide laminate at room temperature. As described above, it was demonstrated that the manganese oxide thin film 2 which allows switching at room temperature can be obtained.

2-2. Example 2

In Example 1, an example of the oxide laminate was described comprising the strongly-correlated oxide thin films contiguous to both surfaces of the manganese oxide thin film. However, dimensional crossover can be utilized even when an oxide laminate is used in which the strongly-correlated oxide thin film is contiguous to only one surface of the manganese oxide thin film. In order to confirm this point, Example 2 of the present embodiment is described which is an oxide laminate having a two-layer structure similar to the one shown in FIG. 2(a). In Example 2, the substrate 1 used was an LSAT (110) substrate, the strongly-correlated oxide thin film 3 corresponding to only 14 atomic layers of LSMO was prepared and the manganese oxide thin film 2 was formed thereon corresponding to only 6 atomic layers of $TbMnO_3$. The oxide laminate of Example 2, namely the manganese oxide thin film 2 and the strongly-correlated oxide thin film 3, was prepared in the similar manners as Example 1.

The specimen prepared as Example 2 was provided with a 4-terminal electrode and the resistance in the plane was measured without application of a magnetic field. During the course of increasing temperature from low (below liquid nitrogen temperature), insulator-metal transition was first observed at about 200 K. This results from insulator-metal transition of LSMO which is the strongly-correlated oxide thin film 3. Subsequent increase of the temperature resulted in transition of the whole specimen into an insulator at the temperature range (253 to 353 K) including room temperature (300 K) at which electronic devices are supposed to operate. Magnetoresistance was measured by the similar manner as Example 1 and the specimen of Example 2 behaved to show 1 kΩ under a magnetic field with the magnetic flux density of 5 T and 100 kΩ without application of a magnetic field. Thus the magnetoresistance at room temperature of Example 2 was lower than the specimen of Example 1 under application of a magnetic field while the increase in the resistance without application of a magnetic field was rather small with the change in resistance being as low as within 2 digits. This change in resistance was sufficiently detectable; however it is ideally further greater. The present inventor believes that the change in resistance was low because of leakage current from LSMO which is the strongly-correlated oxide thin film 3 formed to have a high thickness.

Similar magnetoresistance effect was measured with the configuration shown in FIG. 2(b) with the reversed order of the thin films on the substrate, namely a specimen prepared by preparing the manganese oxide thin film 2 corresponding to $TbMnO_3$ on the side of substrate 1 and then preparing the strongly-correlated oxide thin film 3 corresponding to LSMO.

2-3. Example 3

Example 3 was an experiment to confirm the reason as to why a high magnetoresistant effect was not obtained with the two-layer structure of Example 2. In Example 3, a specimen was prepared having a lower total thickness than that of the oxide laminate of Example 2. One of objects of Example 3 is to confirm the speculation that the reason of small change in resistance in Example 2 was the increased leakage current resulting from a high thickness of the strongly-correlated oxide thin film 3 corresponding to LSMO. Specifically, the specimen of Example 3 was prepared by preparing, on the substrate 1 corresponding to an LSAT (110) substrate, the strongly-correlated oxide thin film 3 corresponding to only 8 atomic layers of LSMO that were fewer than Example 2 and then preparing the manganese oxide thin film 2 corresponding to only 10 atomic layers of $TbMnO_3$ that was thicker than Example 2. Accordingly, contrary to Example 2, the specimen of Example 3 did not show magnetoresistance effect at all in the range from without magnetic field to a magnetic field of 5 T. This is believed to be due to an increase in the thickness of the manganese oxide thin film corresponding to the TbMnO$_3$ layer. In the 4-terminal measurement, the distance (electrode distance) between two electrodes for application of current at both ends among four electrodes linearly aligned with certain distances was changed from 500 μm as in Example 2 to 5 μm. Resistance was measured by controlling the amount of current applied to the manganese oxide thin film 2 and using an intermediate pair of electrodes for voltage measurement. The resistance was 100 MΩ with application of 0.1 μA to but was decreased to as low as 1 kΩ with application of 50 μA, demonstrating that the change in resistance was 5 digits or more between applied electric current of 0.1 μA to and 50 μA. The measurement was also carried out under simultaneous application of electric current and magnetic field, i.e., 10 μA was applied while a magnetic field with the magnetic flux density of 5 T was applied. This time, it was revealed that the magnetoresistance effect was measured. Therefore it is revealed that insulator-metal transition can be obtained at room temperature by application of multiple external fields.

Modified Examples of the Present Embodiment

The present embodiment can be carried out with the configurations of the manganese oxide thin film and the oxide laminate other than those explicitly described including Examples 1 to 3. For example, the substrate employed may be other than the STO (110) substrate (Example 1) or the LSAT (110) substrate (Examples 2 and 3). In order to adjust the relationship of the lattice constant between the formed manganese oxide and the substrate, a solid solution may be used which contains multiple elements having the same valence (+3) at the A sites of manganese oxide. Examples thereof may include solid solution having the composition Pr$_{1-x}$Nd$_x$MnO$_3$ (0<x<1) or the like, namely containing PrMnO$_3$ and NdMnO$_3$ at the ratio 1-x:x. Particularly PrMnO$_3$ and NdMnO$_3$ form solid solution in whole composition range at any ratio. Therefore the composition ratio of the manganese oxide thin film can be adjusted by preparing a target at a desired ratio by laser ablation similar to the above Examples. As described above, Examples 1 to 3 exploit dimensional crossover by means of the configuration of the oxide laminate in order to facilitate external detection of Mott transition. However, switching capabilities per se by controlling Mott transition at room temperature with an external field are realized even in the case of the manganese oxide thin film without forming a laminate.

The embodiments of the present invention have been specifically described hereinabove. The embodiments and Examples are described for the purpose of illustration of the present invention, and materials and compositions of the thin film and the substrate, film thickness, formation method thereof, type and application method of the external field and the like exemplified in the present embodiments are not limited to the above embodiments. The scope of the invention of the present application is rather defined by the descriptions in the claims. Modified examples within the scope of the present invention including other combinations of the above embodiments are also encompassed by the claims.

The present invention provides a manganese oxide thin film and an oxide laminate for allowing switching capabilities by Mott transition at room temperature controlled by an external field which has application for devices utilizing the switching phenomenon by means of application of an external field such as a magnetic field, light, electricity or pressure.

The invention claimed is:

1. A manganese oxide thin film formed on a plane of a substrate, comprising:
   a substrate; and
   a manganese oxide thin film formed on a plane of the substrate and having a composition represented by composition formula RMnO$_3$, where R consists of at least two trivalent rare earth elements selected from the group consisting of La, Ce, Pr, Nd, Pm, Sm, Eu, Gd, Tb and Dy, and where both elements R and Mn form the same atomic layer parallel to the plane of the substrate.

2. The manganese oxide thin film according to claim 1, wherein the substrate has a crystal lattice and a lattice constant, wherein the manganese oxide thin film has, as a bulk substance, a crystal lattice and a lattice constant defined by a cubic root of a unit cell volume of the crystal lattice, and wherein the lattice constant of the manganese oxide thin film is lower than the lattice constant of the substrate.

3. The manganese oxide thin film according to claim 1, wherein the substrate has a plane orientation (110).

4. An oxide laminate, comprising:
   a substrate; and
   a manganese oxide thin film formed on a plane of the substrate and having a composition represented by composition formula RMnO$_3$, where R consists of at least one trivalent rare earth element selected from the group consisting of La, Ce, Pr, Nd, Pm, Sm, Eu, Gd, Tb and Dy, and where both elements R and Mn form the same atomic layer parallel to the plane of the substrate;
   a first strongly-correlated oxide thin film that is contiguous to one surface of the manganese oxide thin film; and
   a second strongly-correlated oxide thin film that is contiguous to another surface of the manganese oxide thin film and that is formed of a material that is the same material as that of the first strongly-correlated oxide thin film,
   wherein a total thickness, t, of the oxide laminate, a thickness, tm, of the manganese oxide thin film, and thicknesses, t1 and t2, respectively of the first and second strongly-correlated oxide thin films satisfy a relation, relative to a critical thickness, tc, by which the strongly-correlated oxide thin film has a metallic phase, as follows:

$t = tm + t1 + t2 > tc$ and $\max(t1, t2) < tc$, where max (t1, t2) is a function which returns a maximum value among variables.

5. An oxide laminate, comprising:
   a substrate;
   a manganese oxide thin film formed on a plane of the substrate and having a composition represented by composition formula RMnO$_3$, where R consists of at least one trivalent rare earth element selected from lanthanoids, and where both elements R and Mn form the same atomic layer parallel to the plane of the substrate,
   a strongly-correlated oxide thin film that is contiguous to the manganese oxide thin film,
   wherein a total thickness, t, of the oxide laminate, a thickness, tm, of the manganese oxide thin film, and a thickness, t1, of the strongly-correlated oxide thin film satisfy a relation, relative to a critical thickness, tc, by which the strongly-correlated oxide thin film has a metallic phase, as follows:

$t = tm + t1 > tc$ and $t1 < tc$.

* * * * *